(12) United States Patent
Büber et al.

(10) Patent No.: US 10,979,016 B2
(45) Date of Patent: Apr. 13, 2021

(54) BROADBAND PROBES FOR IMPEDANCE TUNERS

(71) Applicant: Maury Microwave, Inc., Ontario, CA (US)

(72) Inventors: M. Tekamül Büber, Anaheim, CA (US); Sathya Padmanabhan, Glendora, CA (US)

(73) Assignee: Maury Microwave, Inc., Ontario, CA (US)

( * ) Notice: Subject to any disclaimer, the term of this patent is extended or adjusted under 35 U.S.C. 154(b) by 0 days.

(21) Appl. No.: 16/712,907

(22) Filed: Dec. 12, 2019

(65) Prior Publication Data

US 2020/0119707 A1 Apr. 16, 2020

Related U.S. Application Data

(62) Division of application No. 15/873,302, filed on Jan. 17, 2018.

(51) Int. Cl.
*H03H 7/38* (2006.01)
*G01R 1/26* (2006.01)
*G01R 1/067* (2006.01)
*G01R 27/32* (2006.01)
*H01P 5/04* (2006.01)
*G01R 31/28* (2006.01)

(52) U.S. Cl.
CPC ........... *H03H 7/38* (2013.01); *G01R 1/06772* (2013.01); *G01R 1/26* (2013.01); *G01R 27/32* (2013.01); *H01P 5/04* (2013.01); *G01R 31/2822* (2013.01)

(58) Field of Classification Search
CPC ........ H03H 7/38; H03H 7/40; G01R 1/06772; G01R 1/26
USPC .................................... 333/263, 33, 34, 17.3
See application file for complete search history.

(56) References Cited

U.S. PATENT DOCUMENTS 9,252,738 B1 * 2/2016 Tsironis .................... H03H 7/38

* cited by examiner

*Primary Examiner* — Stephen E. Jones
(74) *Attorney, Agent, or Firm* — Larry K. Roberts

(57) ABSTRACT

A multi-section probe and a tapered probe for impedance tuners to broaden the band width of the probes and hence the band width of the tuners. The multi-section probe and the tapered probe are configured to transform the characteristic impedance of the tuner transmission line step-by-step or continuously to a target impedance value.

18 Claims, 6 Drawing Sheets

BROADBAND PROBES FOR IMPEDANCE TUNERS

CROSS-REFERENCE TO RELATED APPLICATION

This application is a divisional application of U.S. application Ser. No. 15/873,302 filed Jan. 17, 2018, the entire contents of which application are incorporated herein by this reference.

BACKGROUND

Mechanical impedance tuners use probes to simulate impedance values for various microwave and RF measurements such as load pull or source pull measurements or noise parameter measurements. The transmission line of the tuner may be a slab line. A slab line is a type of transmission line having opposed parallel slabs (or plates) with a center conductor between them. The slabs act as the outer conductor of the transmission line. The probes are movable in a direction transverse to the center conductor of the transmission line of the tuner, and also in a direction along the center conductor. As the probe moves closer to the center conductor, the impedance mismatch increases, while the mismatch decreases as the probe is moved away from the center conductor. The probes can generate high reflections and act to transform the characteristic impedance of the slab line to other impedance values. A major shortcoming is, as is known to microwave engineers, the narrow band of these probes.

Commonly owned U.S. Pat. No. 7,589,601 describes multi-section probes, in which the sections are separated by gaps.

DETAILED DESCRIPTION

Figure 1:
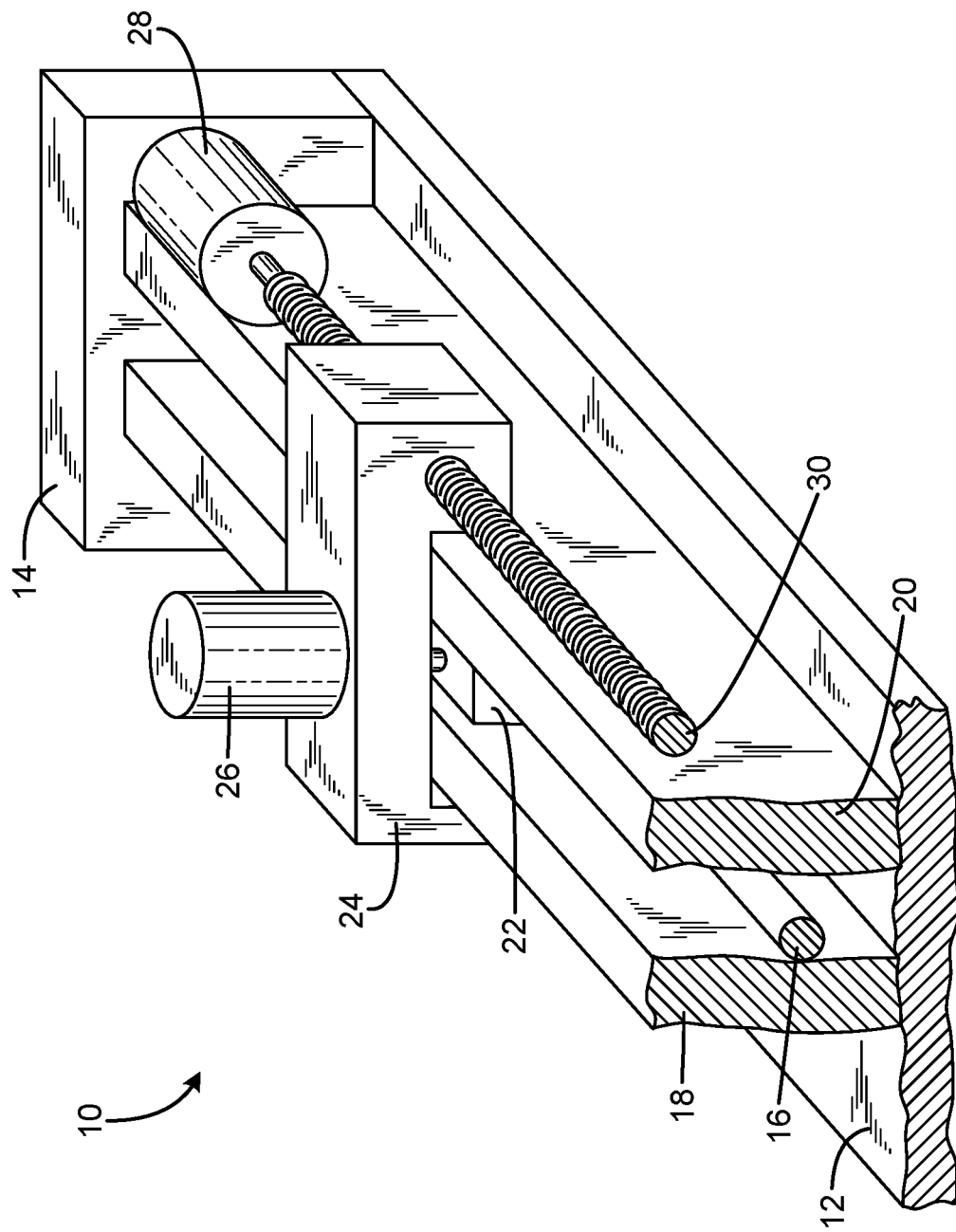
FIG. 1 is an isometric cutaway view of an automated tuner with a moving carriage and a probe.

FIG. 1 schematically depicts an exemplary embodiment of an automated, slab line tuner system 10. In this embodiment, a base plate 12, an end plate 14 and planar conductor slabs 18, 20 are fabricated of a metal or metalized dielectric material. A center conductor 16 is supported between the slabs 18, 20, and by a coaxial connector (not visible in FIG. 1) fitted into the end wall 14. An electrically conductive probe 22 is mounted on a carriage 24 for motion transverse to the center conductor axis. A probe motor 26 drives the probe 22 along the transverse path toward or away from the center conductor axis. The carriage is driven along a path parallel to the center conductor axis, by a leadscrew 30 driven by a carriage drive motor 28. In an exemplary embodiment, moving the carriage primarily results in changing the phase of the reflection, and moving the probe vertically (transversely) primarily changes the magnitude of the reflection; hence together (horizontal and vertical movements) change the impedance presented at the reference plane (usually the end of a connector at the end of the center conductor) by the tuner. Exemplary slab line impedance tuners are described, for example, in U.S. Pat. Nos. 7,589,601; 8,823,392; and 8,907,750, the entire contents of which are incorporated herein by this reference.

In microwave and RF circuits, a multi-section quarter wave transformer has been used to generate wide band quarter wave transformers for microstrip or coaxial lines. These multi-section transformers can be designed in most case either using the maximally flat filter response or Chebyshev filter response. Quarter wave transformers are described, for example, in "Microwave Engineering," Second Edition, David M. Pozar, John Wiley & Sons, Inc., 1998, at Chapters 5.4 to 5.8, pages 271-295 (hereinafter referred to as "Pozar").

In accordance with an aspect of the invention, instead of using one section of a probe in a mechanical impedance tuner to transform the characteristic impedance of the main line, to a very low or very high impedance value in one step, the characteristic impedance is transformed step-by-step or probe section by probe section using a plurality of adjacent probe sections to intermediate impedance values to reach finally the target impedance value. This method, if done properly, widens the bandwidth significantly, in fact arbitrarily depending on the number of sections; see, e.g. Pozar at pages 277-278. How to calculate how many sections are needed for a desired bandwidth and the varying impedance values is explained in the literature, e.g. Pozar at page 278-286.

Figure 2:
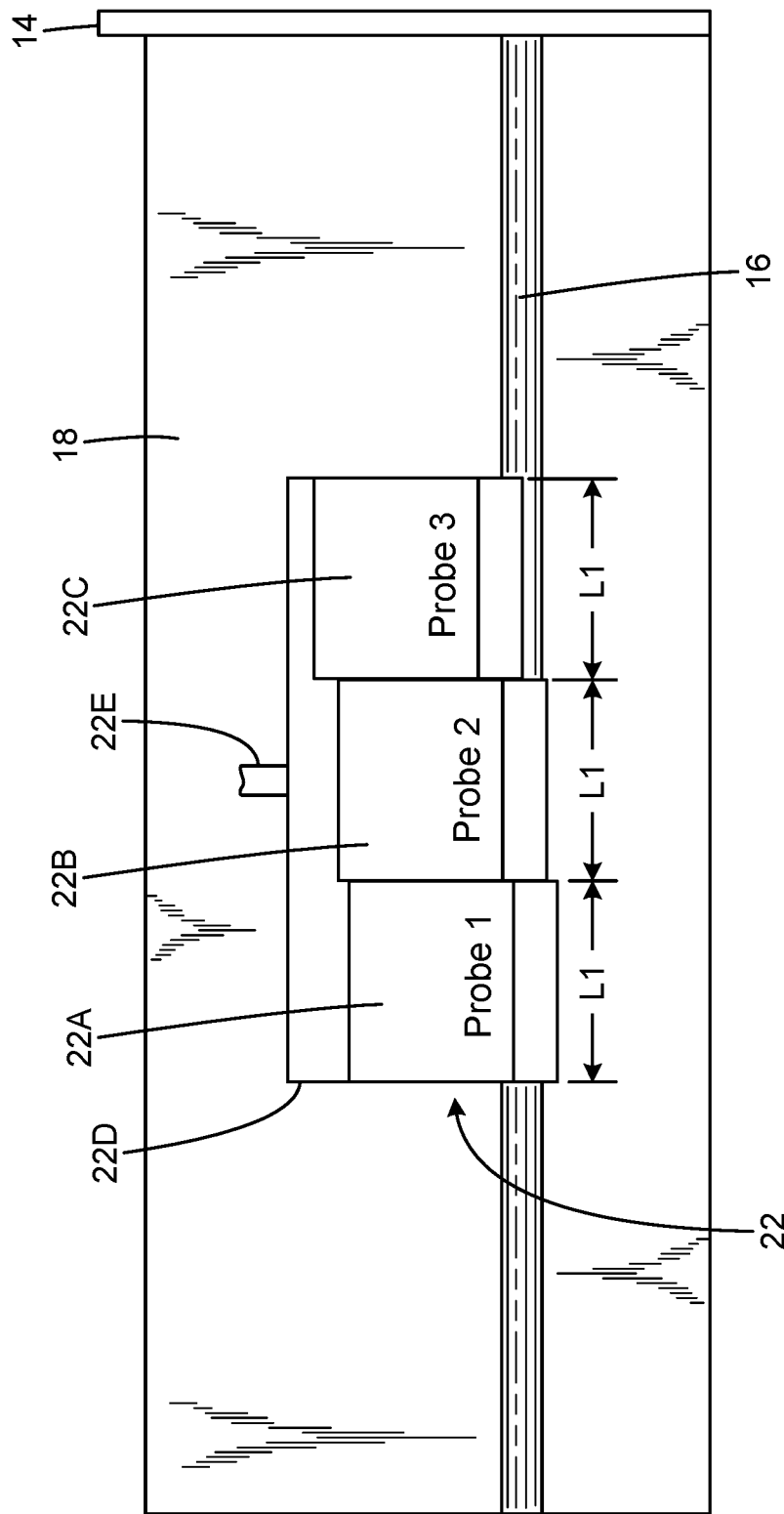
FIG. 2 is a cutaway view of an impedance tuner with a multi-section probe.

In accordance with aspects of the invention, multi-section probes are described for use in impedance tuners, wherein each probe section corresponds to a particular impedance value for the transmission line. There are different methods of realizing such multi-section probes. In one embodiment, the same probe section is used several times as needed for the desired broad bandwidth, with the probe sections positioned next to each other but at stepped heights relative to the center conductor of the slab line. In this example, the impedance value is at a given height or vertical position of the probe in relation to the slab line center conductor. An example is illustrated in FIG. 2, in which the probe 22 includes three probe sections 22A, 22B and 22C, with each probe section having a length equal to one quarter wavelength at the center frequency of the band. The probe sections are mounted together in a fixed relationship, and fitted to a probe drive (not shown in FIG. 2) for movement in a ganged relationship toward or away from the center conductor. The probe sections may be attached to a probe bracket 22D, for example, which is connected to the probe drive by a post structure 22E. The probe sections could also be fabricated as an integral one-piece structure, instead of several separately constructed sections assembled together.

An exemplary design technique for designing a multi-section probe is as follows:

1. Determine the desired specifications as to what maximum reflection, e.g., 0.9 reflection magnitude, is needed in which characteristic impedance environment, e.g., 50 ohm, and the desired bandwidth, e.g. between 0.65 and 9 GHz, along with the desired reflection magnitude $\Gamma_m$ at the band edges, e.g., 0.82 reflection magnitude. This will also fix the center frequency of the design and the length of each probe section as quarter wave length at the center frequency, e.g. 4.825 GHz in the above example.

2. For each type of design, Chebyshev or binomial (maximally flat), determine the design constants and number of sections needed:

Estimate initially the number of sections N. Then estimate the constant $$A = 2^{-(N+1)} \ln\left(\frac{R_L}{Z_0}\right)$$

where $R_L$ is the low impedance target and Z0 is the characteristic impedance of the system, usually 50 ohm. Then, using the reflection $\Gamma_m$ needed at the band edge, calculate the bandwidth using $$\Delta f = 2f_0 - \frac{4f_0}{\pi} \arccos\left[\frac{1}{2}\left(\frac{\Gamma_m}{|A|}\right)^{\frac{1}{N}}\right]$$

where $f_0$ is the center (design) frequency of the probe. If the bandwidth is acceptable, continue, if it is too narrow or too wide, re-estimate the number of sections and repeat iteratively until a satisfactory bandwidth is obtained and the number of sections N is then determined.

3. Once the number of sections N is determined, then determine the required characteristic impedance value for each section, using the following:

Estimate the marginal reflection coefficients $$\Gamma_n = A \frac{N!}{(N-n)! n!}$$

and then determine the characteristic impedance of each section iteratively by $Z_{n+1} = Z_n e^{2\Gamma_n}$ starting with the 50 ohm/Z0 load.

4. Estimate the height of each section above the center conductor to simulate the calculated characteristic impedance for that section. The height of each section in this context is the distance or gap between the center conductor and the top of the trough of the section. This step can typically be performed through the use of a full 3D electromagnetic field (EM) simulator such as HFSS (by ANSYS) or CST (marketed by Computer Simulation Technology), or any other full 3D electromagnetic simulator.

5. Once the height of each section is determined this way, in the final step, simulate the performance of the design of the whole probe using the 3D EM simulator to verify the broad band response and make the final tuning adjustments to the heights if further adjustments in heights are needed.

Figure 3A:
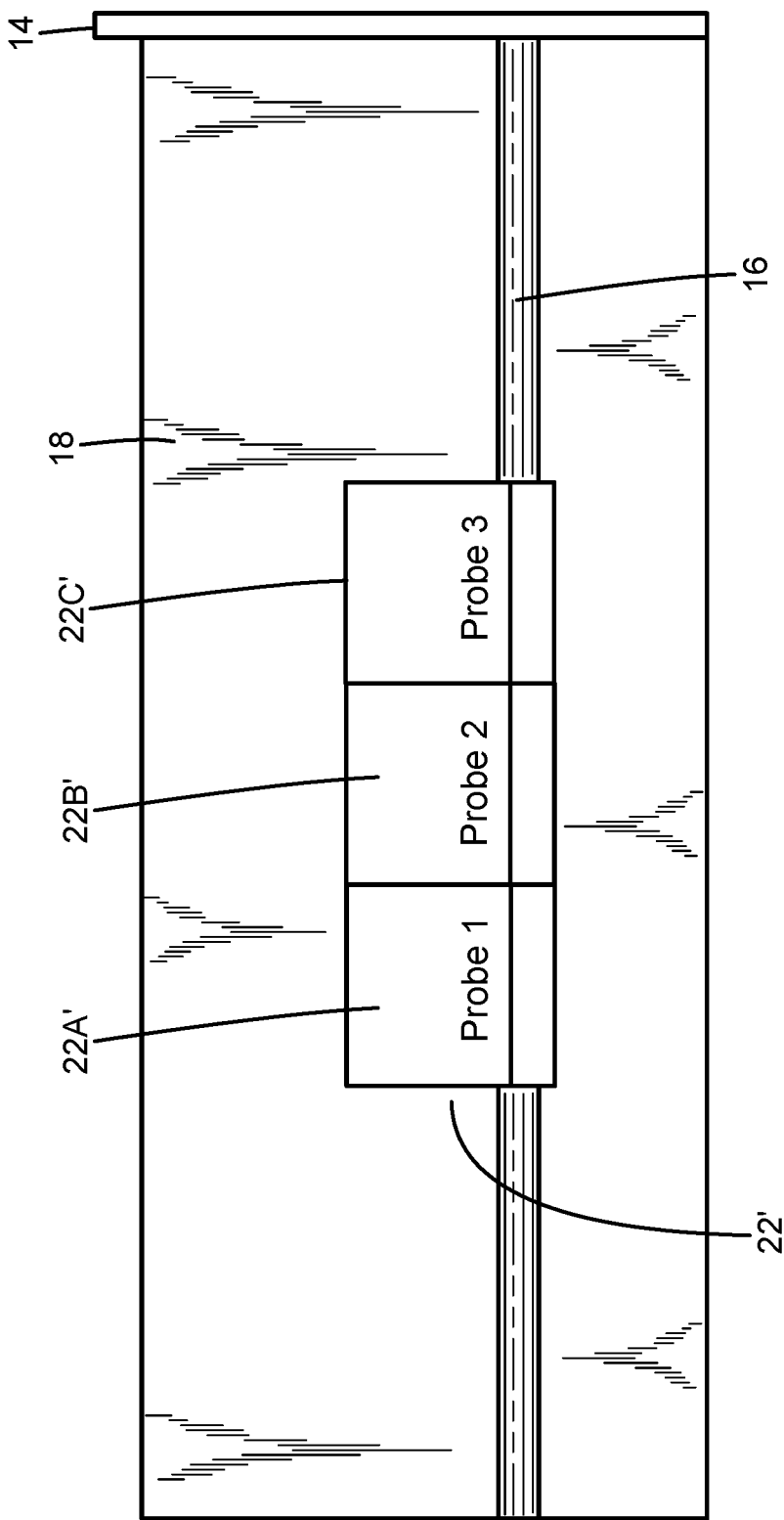
FIG. 3A is a cutaway side view of an impedance tuner with an alternate embodiment of a multi-section probe.
Figure 3B:
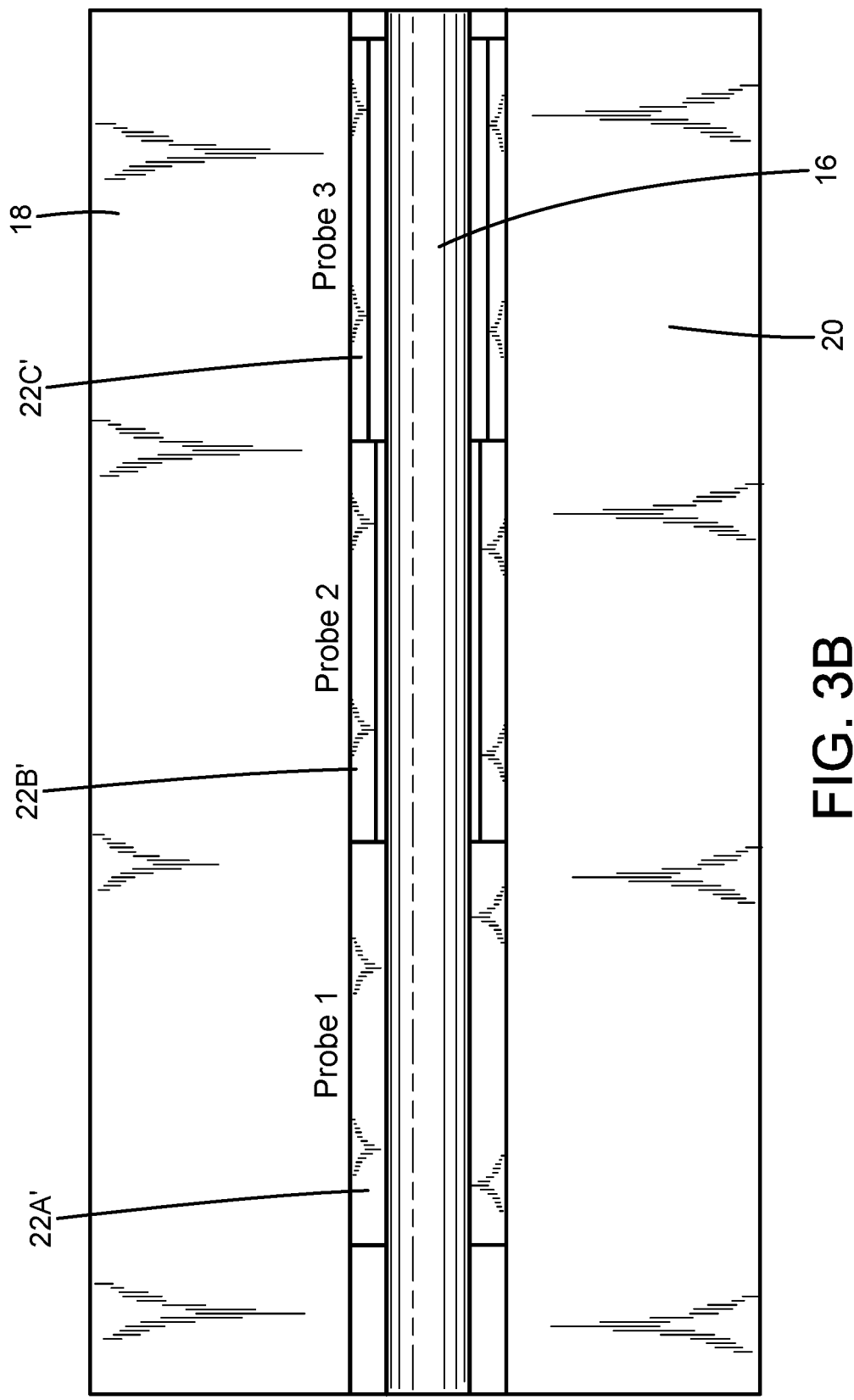
FIG. 3B is a bottom view of the impedance tuner and probes of FIG. 3A, showing that the trough of each probe section is different from the trough of the other probe sections.
Figure 3C:
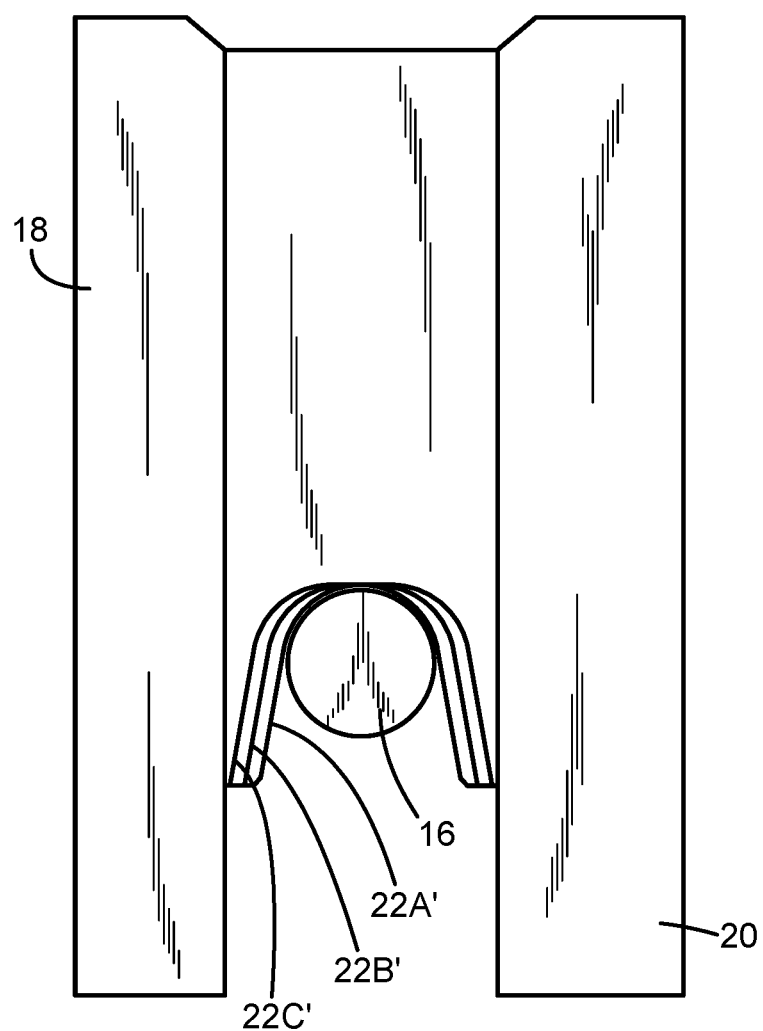
FIG. 3C is a diagrammatic end view, illustrating the probe section trough widening and change in the cross-sectional profile of the respective probe sections.

Another embodiment of a multi-section probe uses the same height for all sections but varies the cross-sectional profile (also known as the trough) to make the trough wider and wider for successive probe sections. The troughs are configured to allow the probe sections when brought closer to the center conductor to straddle the center conductor. In this case, the probe could be made as a single integrated probe, with the trough made wider and wider every one-quarter wavelength. FIGS. 3A-3C illustrate an exemplary multi-section probe 22' using probe sections 22A', 22B', 22C', which are mounted together at equal heights relative to the center conductor 18, but with different trough configurations. As with the probe 22 of FIG. 2, the multiple probe sections are mounted adjacent one another, and mounted for ganged movement (or made as a one single unitary structure). FIGS. 3B and 3C show that the trough of probe section 22B' is wider than the trough of probe section 22A', and that the trough of probe section 22C' is wider than the trough of probe 22B'. Thus the probe sections have troughs each of which is wider than the previous adjacent probe section, with the characteristic impedance increasing with each widening trough. The trough width corresponds to the impedance obtained using full 3D EM simulation.

Note that the probe bracket and post for connecting to the probe drive are omitted from FIGS. 3A-3C for clarity.

A further embodiment of the probe is a combination of the first two embodiments, i.e. a multi-section probe in which both the probe height and the trough profile vary, i.e. from probe section to probe section.

An even better but more difficult to realize probe design is to use a tapered quarter wave transformer instead of multi-section transformers. This tapered transformer has a continuous change of the impedance of the transformer instead of stepped change by multi-section transformer. Various methods such as exponential taper, triangular taper, Klopfenstein taper are used for different taper shapes and different applications. It is known that the Klopfenstein taper is the optimal taper shape for these types of quarter wave transformers. See, for example, Pozar at chapter 5.8, pages 288-295.

Figure 4:
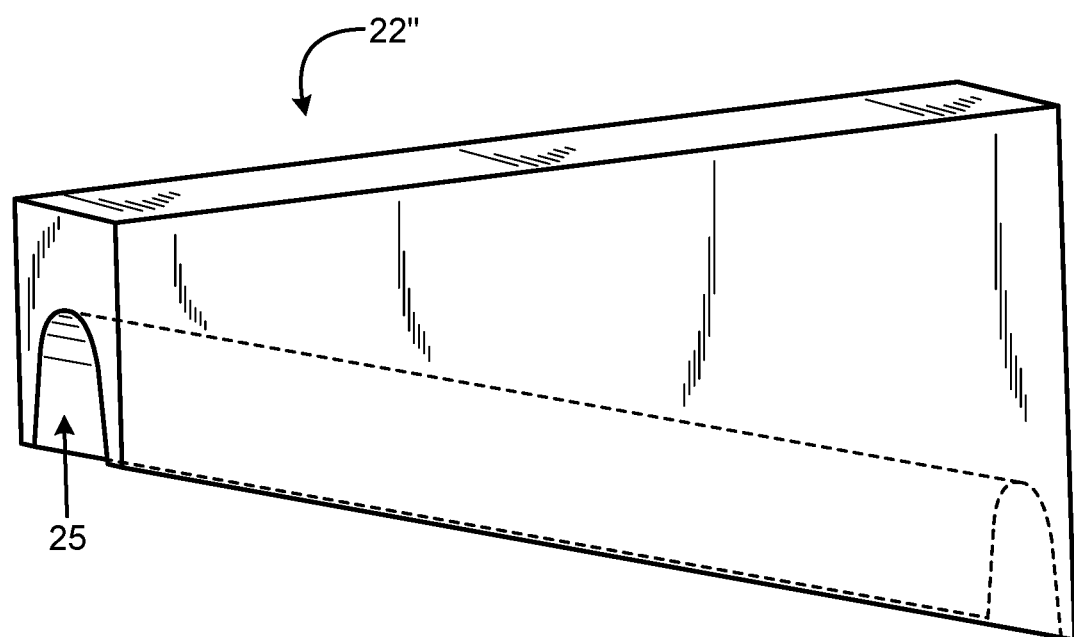
FIG. 4 is a diagrammatic isometric view of an exemplary embodiment of a tapered probe with a straight taper angle.

FIG. 4 illustrates an exemplary embodiment of a tapered probe 22" with a trough 25. The height of the probe is tapered, increasing from a first end (left in FIG. 4) to the opposite end (right in FIG. 4). The probe 22" will be mounted to the probe drive by a post (not shown in FIG. 4) such that the top surface is parallel to the center conductor.

Both techniques described above, i.e., the stepped height or varying trough shape, could be also used for the tapered probe, whether it is a triangular or exponential or Klopfenstein taper.

An exemplary sequence of steps to design a tapered probe is as follows:

1. Establish the required specifications for center frequency, bandwidth, desired reflection at center frequency and desired reflection at band edges 2. Estimate the needed length L of the tapered probe (the longer, the wider the band width). One can estimate this length from the multi section probe design (e.g., Chebyshev), so that the length of the tapered probe is equal to the sum of the lengths of the sections of the multi-section probe structure.

3. Determine the constants and the impedance profile for the probe from 0 up to the length L. This profile depends on the chosen taper style, exponential, triangular or Klopfenstein.

4. Once the impedance profile is determined, now one needs to estimate the probe profile. This is done by estimating the how much the probe height above center conductor corresponds to that impedance. This may be done using a 3D EM simulator such as HFSS or CST. The probe height for the entire probe is estimated, i.e. how the taper profile or taper height varies along the probe.

5. Simulate the probe performance using a 3D EM simulator. If necessary, the parameters might need to be adjusted or tuned such as probe length and probe height profile.

In a further embodiment, the tapered probe may incorporate both height tapering and trough profile tapering, i.e. both the height and the trough profile vary continuously along the probe length.

All these embodiments can be implemented with probes that touch the slab lines or that do not touch the slab lines.

Although the foregoing has been a description and illustration of specific embodiments of the subject matter, various modifications and changes thereto can be made by persons skilled in the art without departing from the scope and spirit of the invention.

The invention claimed is:

1. A probe for a slab line impedance tuner system operable over a frequency bandwidth, the tuner system including opposed slab conductor plates and a center conductor disposed between the slab conductor plates, a probe carriage and a drive system for moving the probe carriage in a longitudinal direction parallel to the center conductor, the probe comprising:
    a plurality of probe sections mounted adjacent to one another with no gaps between adjacent probe sections, wherein each probe section has a different characteristic impedance from every other probe section at some position in the range of the longitudinal directional movement of the probe; and
    wherein a number of the probe sections forming the plurality of probe sections is sufficient to provide a desired characteristic impedance transformation for the frequency bandwidth, wherein the characteristic impedance of the tuner system is transformed probe-section by probe-section by the probe to intermediate impedance values to reach a target impedance value.

2. The probe of claim 1, wherein the plurality of probe sections are separate pieces supported for movement together along the center conductor and in a direction transverse to the center conductor.

3. The probe of claim 1, wherein the plurality of probe sections are fabricated together as a unitary one-piece structure.

4. The probe of claim 1, wherein each of the plurality of probe sections is at a different height relative to the center conductor to achieve the said different characteristic impedance of each probe from every other probe section.

5. The probe of claim 1, wherein each probe section has a cross-sectional profile defining a trough configured to straddle the center conductor, and wherein the cross-sectional profile of each of respective ones of the plurality of probe sections is such that the troughs are wider for each successive probe section along the longitudinal direction to achieve the said different characteristic impedance of each probe from every other probe section.

6. The probe of claim 1, wherein each probe section has a cross-sectional profile defining a trough configured to straddle the center conductor, and wherein each of the plurality of probe sections is at a different height relative to the center conductor and wherein the cross-sectional profile of each of the plurality of probe sections is such that the troughs are wider for each successive probe along the longitudinal direction to achieve the said different characteristic impedance of each probe from every other probe section.

7. The probe of claim 1, wherein each probe section has a nominal length dimension along the longitudinal direction of one quarter wavelength at a frequency at a midpoint of the bandwidth.

8. A slab line impedance tuner system operable over a frequency bandwidth, the tuner system comprising:
    a slab line transmission including opposed slab conductor planes and a center conductor disposed between the slab conductor planes;
    a probe;
    a probe carriage carrying the probe;
    a carriage drive system for moving the probe carriage in a longitudinal direction parallel to the center conductor;
    a probe drive system for moving the probe in a transverse direction relative to the center conductor to position the probe closer to or further away from the center conductor; and
    wherein the probe includes:
    a plurality of probe sections mounted adjacent to one another with no gaps between adjacent sections, wherein each probe section has a different characteristic impedance from every other probe section at some position in the range of the longitudinal directional movement of the probe; and
    wherein a number of the probe sections forming the plurality of probe sections is sufficient to provide a desired characteristic impedance transformation for the frequency bandwidth, wherein the characteristic impedance of the tuner system is transformed probe-section by probe-section by the probe to intermediate impedance values to reach a target impedance value.

9. The system of claim 8, wherein the plurality of probe sections are separate pieces supported for movement together along the center conductor and in a direction transverse to the center conductor.

10. The system of claim 8, wherein the plurality of probe sections are fabricated together as a unitary one-piece structure.

11. The system of claim 8, wherein each of the plurality of probe sections is at a different height relative to the center conductor to achieve the said different characteristic impedance of each probe from every other probe section.

12. The system of claim 8, wherein each probe section has a cross-sectional profile defining a trough configured to straddle the center conductor, and wherein the cross-sectional profile of each of respective ones of the plurality of probe sections is such that the troughs are wider for each successive probe section along the longitudinal direction to achieve the said different characteristic impedance of each probe from every other probe section.

13. The system of claim 8, wherein each probe section has a cross-sectional profile defining a trough configured to straddle the center conductor, and wherein each of the plurality of probe sections is at a different height relative to the center conductor and wherein the cross-sectional profile of each of the plurality of probe sections is such that the troughs are wider for each successive probe along the longitudinal direction to achieve the said different characteristic impedance of each probe from every other probe section.

14. The system of claim 8, wherein each probe section has a nominal length dimension along the longitudinal direction of one quarter wavelength at a frequency at a midpoint of the bandwidth.

15. A probe for a slab line impedance tuner system operable over a frequency bandwidth, the tuner system including opposed slab conductor planes and a center conductor disposed between the slab conductor planes, a probe carriage and a drive system for moving the probe carriage in a longitudinal direction parallel to the center conductor, the probe comprising:
    a plurality of quarter wavelength, electrically conductive probe sections, each probe section having a nominal length dimension along the longitudinal direction of one quarter wavelength at a frequency at a midpoint of the bandwidth, and wherein each probe section has a cross-sectional profile defining a trough configured to straddle the center conductor as the probe is moved transversely toward the center conductor;

wherein the probe sections are supported for movement together along the center conductor and in a direction transverse to the center conductor, the probe sections mounted together with no gaps between adjacent probe sections; and wherein a number of the probe sections forming the plurality of probe sections is sufficient to provide a desired characteristic impedance transformation for the frequency bandwidth, wherein the characteristic impedance of the tuner system is transformed probe-section-by-probe-section by the probe to intermediate impedance values to reach a target impedance value.

16. The probe of claim 15, wherein the probe sections are positioned next to each other and at stepped heights of the trough relative to the center conductor of the slab line.

17. The probe of claim 15, wherein the probe sections are positioned next to each other and at the same height relative to the center conductor of the slab line, and wherein the cross-sectional profile of each of the plurality of probe sections is varied such that the troughs are wider for each successive probe section.

18. The probe of claim 15, wherein the probe sections are positioned next to each other and at stepped heights relative to the center conductor of the slab line, and wherein the cross-sectional profile of each of the plurality of probe sections is varied such that the troughs are wider for each successive probe section.

* * * * *